US010554127B2

(12) United States Patent
Gong

(10) Patent No.: US 10,554,127 B2
(45) Date of Patent: Feb. 4, 2020

(54) CONTROL CIRCUIT AND CONTROL METHOD FOR MULTI-OUTPUT DC-DC CONVERTER

(71) Applicant: Chengdu Monolithic Power Systems Co., Ltd., Chengdu (CN)

(72) Inventor: Junyong Gong, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 242 days.

(21) Appl. No.: 15/665,375

(22) Filed: Jul. 31, 2017

(65) Prior Publication Data

US 2018/0041117 A1 Feb. 8, 2018

(30) Foreign Application Priority Data

Aug. 2, 2016 (CN) .......................... 2016 1 0622009

(51) Int. Cl.
*H02M 3/156* (2006.01)
*H03L 7/08* (2006.01)
*H02M 1/08* (2006.01)

(52) U.S. Cl.
CPC ............. *H02M 3/156* (2013.01); *H02M 1/08* (2013.01); *H03L 7/08* (2013.01)

(58) Field of Classification Search
CPC . H02M 3/156; H02M 1/084; H02M 2001/008
See application file for complete search history.

(56) References Cited

U.S. PATENT DOCUMENTS

| 2013/0038302 A1* | 2/2013 | Qian | ..................... H02M 3/156 323/271 |
| 2016/0172959 A1* | 6/2016 | Hu | ........................ H02M 3/156 307/31 |
| 2017/0133919 A1 | 5/2017 | Li | |

\* cited by examiner

*Primary Examiner* — Rexford N Barnie
*Assistant Examiner* — Elim Ortiz
(74) *Attorney, Agent, or Firm* — Perkins Coie LLP

(57) ABSTRACT

A multi-output DC-DC converter with constant on time control. The multi-output DC-DC converter has N clock signals, and N switching circuits converting an input voltage signal to N output voltage signals respectively. The N clock signals have the same frequency and a predetermined phase shift between every two successive clock signals of the N clock signals. When the N switching circuits are operated in a steady state, each of the N switching circuits is synchronized with a corresponding one of the N clock signals.

11 Claims, 11 Drawing Sheets

CONTROL CIRCUIT AND CONTROL METHOD FOR MULTI-OUTPUT DC-DC CONVERTER

CROSS-REFERENCE TO RELATED APPLICATION

This application claims the benefit of CN application No. 201610622009.5, filed on Aug. 2, 2016, and incorporated herein by reference.

TECHNICAL FIELD

The present invention generally refers to electrical circuit, and more particularly but not exclusively refers to control circuit and control method for multi-output DC-DC converter.

BACKGROUND

In power conversion applications, constant on time ("COT") control is widely used in DC-DC converters since the DC-DC converters using the COT control may have a fast dynamic response. Compared to a DC-DC converter using peak current control, a DC-DC converter using the COT control has a switching frequency varied with the change in an output current signal. Especially, in a multi-output DC-DC converter, there are multiple channels each of which comprises a sub-switching converter. These sub-switching converters may share a common input voltage signal. It's desired that each of the sub-switching converters uses the input voltage signal in a time division multiplex manner. Since the switching frequency of each of the sub-switching converters using the COT control is varied, it's hard to realize the time division multiplex of the input voltage signal in the multi-output DC-DC converter using the COT control. Thus, in the prior art, the peak current control may typically be adopted to control the multi-output DC-DC converter.

Therefore, it is desired to have a solution for realizing the COT control in the multi-output DC-DC converter.

SUMMARY

Embodiments of the present invention are directed to a multi-output DC-DC converter with COT control, comprising: N switching circuits, coupled to an input terminal of the multi-output DC-DC converter to receive an input voltage signal, wherein each of the N switching circuits is configured to convert the input voltage signal to an output voltage signal at one of N output terminals of the multi-output DC-DC converter, and wherein each of the N switching circuits comprises at least one controllable switch, and wherein N is an integer larger than or equal to 2; a clock generator, configured to generate N clock signals having the same frequency and having a predetermined phase shift between every two successive clock signals of the N clock signals; N COT controllers, wherein each of the N COT controller is configured to control a corresponding one of the N switching circuits, and wherein each of the N COT controllers is configured to receive the input voltage signal, the output voltage signal, a voltage feedback signal indicative of the output voltage signal, and a corresponding one of the N clock signals to generate a control signal, and further configured to synchronize the control signal with said corresponding one of the N clock signals when a corresponding one of the N switching circuits is operated in a steady state, wherein the control signal is configured to control the at least one controllable switch of the corresponding one of the N switching circuits.

Embodiments of the present invention are further directed to a COT control circuit for a multi-output DC-DC converter, wherein the multi-output DC-DC converter comprises N switching circuits configured to convert an input voltage signal to N output voltage signals respectively, and wherein N is an integer larger than or equal to 2, comprising: N sub-controllers, configured to receive N clock signals having the same frequency and having a predetermined phase shift between every two successive clock signals of the N clock signals; each of the N sub-controllers is configured to receive the input voltage signal, an output voltage signal of a corresponding one of the N switching circuits, a voltage feedback signal indicative of the output voltage signal, and a corresponding one of the N clock signals to generate a control signal to control a corresponding switching circuit among the N switching circuits, and further configured to synchronize the control signal with said corresponding one of the N clock signals when the corresponding one of the N switching circuits is operated in a steady state.

Embodiments of the present invention are further directed to a COT control method for a multi-output DC-DC converter, wherein the multi-output DC-DC converter comprises N switching circuits configured to convert an input voltage signal to N output voltage signals respectively, and wherein each of the N switching circuits comprises at least one controllable switch, and wherein N is an integer larger than or equal to 2, comprising: determining whether each of the N switching circuits is operated in a steady state; generating N clock signals having the same frequency and having a predetermined phase shift between every two successive clock signals of the N clock signals; providing N voltage feedback signals, each of the N voltage feedback signals is indicative of a corresponding one of the N output voltage signals; generating N control signals, each of the N control signals is generated based on the input voltage signal, said corresponding one of the N output voltage signals, said corresponding one of the N voltage feedback signals and said corresponding one of the N clock signals, wherein each of the N control signals is synchronized with said corresponding one of the N clock signals when a corresponding one of the N switching circuits is operated in a steady state, and wherein each of the N control signals is configured to control the at least one controllable switch of the corresponding one of the N switching circuits.

BRIEF DESCRIPTION OF THE DRAWINGS

Non-limiting and non-exhaustive embodiments are described with reference to the following drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The phrase "couple" includes direct connection and indirect connection. Indirect connection includes connection through conductor which has resistance and/or parasitic parameters such as inductance and capacitance, or connection through diode, and so on.

Figure 1:
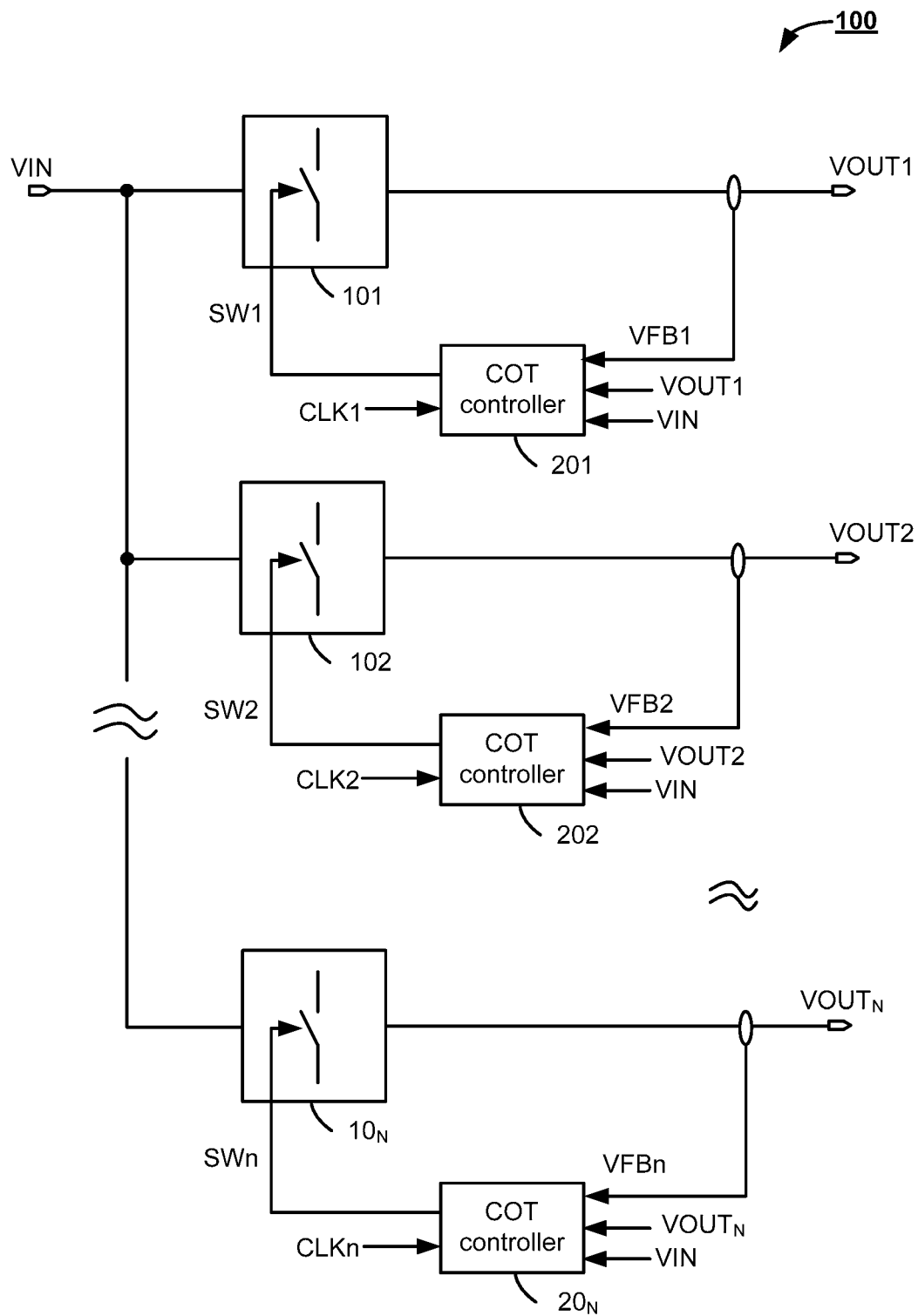
FIG. 1 schematically illustrates a multi-output DC-DC converter 100 with COT control in accordance with an embodiment of the present invention.

FIG. 1 schematically illustrates a multi-output DC-DC converter 100 with COT control in accordance with an embodiment of the present invention. As shown in FIG. 1, the multi-output DC-DC converter 100 may comprise an input terminal configured to receive an input voltage signal VIN, and N output terminals respectively configured to provide N output voltage signals (VOUT1, VOUT2, ..., $VOUT_N$), wherein N is an integer larger than or equal to 2. In the exemplary embodiment of FIG. 1, the multi-output DC-DC converter 100 may further comprise N switching circuits (101, 102, ..., $10_N$) and N COT controller (201, 202, ..., $20_N$). Each of the N COT controller (201, 202, ..., $20_N$) is configured to control a corresponding one of the N switching circuits (101, 102, ..., $10_N$). For example, the first switching circuit 101 is controlled by the first COT controller 201; the second switching circuit 102 is controlled by the second COT controller 202; and the switching circuit $10_N$ is controlled by the COT controller $20_N$, and so forth.

The N switching circuits (101, 102, ..., $10_N$) are together coupled to the input terminal of the multi-output DC-DC converter 100 to receive the input voltage signal VIN. Each of the N switching circuits may comprise at least one controllable switch. The input voltage signal VIN may respectively be converted to each of the N output voltage signals (VOUT1, VOUT2, ..., $VOUT_N$) by switching the at least one controllable switch of the corresponding switching circuit among the N switching circuits (101, 102, ..., $10_N$) on and off in a complementary manner.

As shown in FIG. 1, the first COT controller 201 may be configured to receive the first output voltage signal VOUT1, the input voltage signal VIN, a first voltage feedback signal VFB1 which is indicative of the first output voltage signal VOUT1, and a first clock signal CLK1 to generate a first control signal SW1, wherein the first control signal SW1 is configured to control a first controllable switch of the first switching circuits 101. When the first switching circuit 101 is operated in a steady state, the first COT controller 201 is configured to control the first control signal SW1 to synchronize with the first clock signal CLK1, i.e., the phase of the first control signal SW1 is the same as the phase of the first clock signal CLK1, and the frequency of the first control signal SW1 is the same as the frequency of the first clock signal CLK1. In an embodiment, the phase of the first control signal SW1 is the same as the phase of the first clock signal CLK1, which indicates a phase shift between the rising edging of the first control signal SW1 and the rising edging of the first clock signal CLK1 is zero. The steady state of the first switching circuit 101 indicates that both the input voltage signal VIN and a load of the first switching circuit 101 are invariable. In an embodiment, the first controllable switch may comprise a high-side switch and a low-side switch, and the first control signal SW1 may comprise a high-side control signal and a low-side control signal which are configured to respectively control the high-side switch and the low-side switch.

The second COT controller 202 may be configured to receive the second output voltage signal VOUT2, the input voltage signal VIN, a second voltage feedback signal VFB2 which is indicative of the second output voltage signal VOUT2, and a second clock signal CLK2 to generate a second control signal SW2, wherein the second control signal SW2 is configured to control a second controllable switch of the second switching circuits 102. When the second switching circuit 102 is operated in a steady state, the second COT controller 202 is configured to control the second control signal SW2 to synchronize with the second clock signal CLK2, i.e., the phase of the second control signal SW2 is the same as the phase of the second clock signal CLK2, and the frequency of the second control signal SW2 is the same as the frequency of the second clock signal CLK2. In an embodiment, the phase of the second control signal SW2 is the same as the phase of the second clock signal CLK2, which indicates a phase shift between the rising edging of the second control signal SW2 and the rising edging of the second clock signal CLK2 is zero. The steady state of the second switching circuit 102 indicates that both the input voltage signal VIN and a load of the second switching circuit 102 are invariable. In an embodiment, the second controllable switch may comprise a high-side switch and a low-side switch, and the second control signal SW2 may comprise a high-side control signal and a low-side control signal which are configured to respectively control the high-side switch and the low-side switch.

Similarly, the COT controller $20_N$ may be configured to receive the output voltage signal $VOUT_N$, the input voltage signal VIN, an voltage feedback signal $VFB_N$ which is indicative of the output voltage signal $VOUT_N$, and an clock signal $CLK_N$ to generate an control signal $SW_N$, wherein the control signal $SW_N$ is configured to control an Nth controllable switch of the switching circuits $10_N$. When the switching circuit $10_N$ is operated in a steady state, the COT controller $20_N$ is configured to control the control signal $SW_N$ to synchronize with the clock signal $CLK_N$, i.e., the phase of the control signal $SW_N$ is the same as the phase of the clock signal $CLK_N$, and the frequency of the control signal $SW_N$ is the same as the frequency of the clock signal $CLK_N$. In an embodiment, the phase of the control signal $SW_N$ is the same as the phase of the clock signal $CLK_N$, which indicates a phase shift between the rising edging of the control signal $SW_N$ and the rising edging of the clock signal $CLK_N$ is zero. The steady state of the switching circuit $10_N$ indicates that both the input voltage signal VIN and a load of the switching circuit $10_N$ are invariable. In an embodiment, the Nth controllable switch may comprise a high-side switch and a low-side switch, and the control signal $SW_N$ may comprise a high-side control signal and a low-side control signal which are configured to respectively control the high-side switch and the low-side switch.

In the exemplary embodiment of FIG. 1, these N clock signals (CLK1, CLK2, . . . , $CLK_N$) may have the same frequency and have a predetermined phase shift between every two successive clock signals of the N clock signals (CLK1, CLK2, . . . , $CLK_N$). For example, when N is equal to 2, the predetermined phase shift between the first clock signal CLK1 and the second clock signal CLK2 is 180 degrees. When N is equal to 3, the predetermined phase shift between the first clock signal CLK1 and the second clock signal CLK2 is 120 degrees, the predetermined phase shift between the second clock signal CLK2 and the third clock signal CLK3 is 120 degrees, and the predetermined phase shift between the third clock signal CLK3 and the first clock signal CLK1 is 120 degrees, and so forth.

In the exemplary embodiment of FIG. 1, the N switching circuits (101, 102, . . . , $10_N$) could be illustrated to have a BUCK topology, a BOOST topology, a BUCK-BOOST topology or other suitable topologies. In an embodiment, all of the N switching circuits (101, 102, . . . , $10_N$) are illustrated to have a same topology, e.g., a BUCK topology. In an embodiment, the N switching circuits (101, 102, . . . , $10_N$) may be illustrated to have at least two different topologies. For example, the first switching circuits 101 is illustrated to have the BUCK topology, the second switching circuits 102 is illustrated to have the BOOST topology, and the third switching circuits 103 is illustrated to have a BUCK-BOOST topology, etc.

In an embodiment, during the steady state, the control signal $SW_N$ may be synchronized with the N clock signal $CLK_N$. Therefore, the switching frequency of the multi-output DC-DC converter 100 during the steady state is locked in the frequency of the N clock signals (CLK1, CLK2, $CLK_N$).

Figure 2:
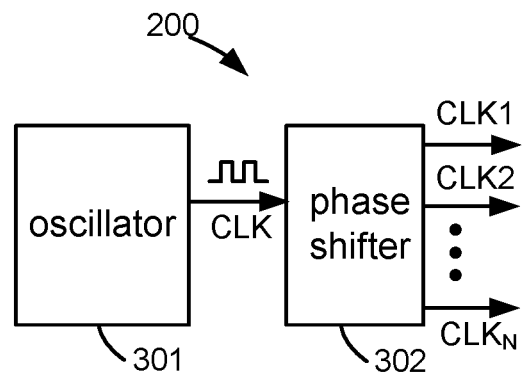
FIG. 2 schematically illustrates a clock generator 200 in accordance with an embodiment of the present invention.

FIG. 2 schematically illustrates a clock generator 200 in accordance with an embodiment of the present invention. As shown in FIG. 2, the clock generator may comprise an oscillator 301 and a phase shifter 302. The oscillator 301 may be configured to generate a master clock signal CLK. The phase shifter 302 may be configured to receive the master clock signal CLK to generate the N clock signals (CLK1, CLK2, . . . , $CLK_N$).

Figure 3:
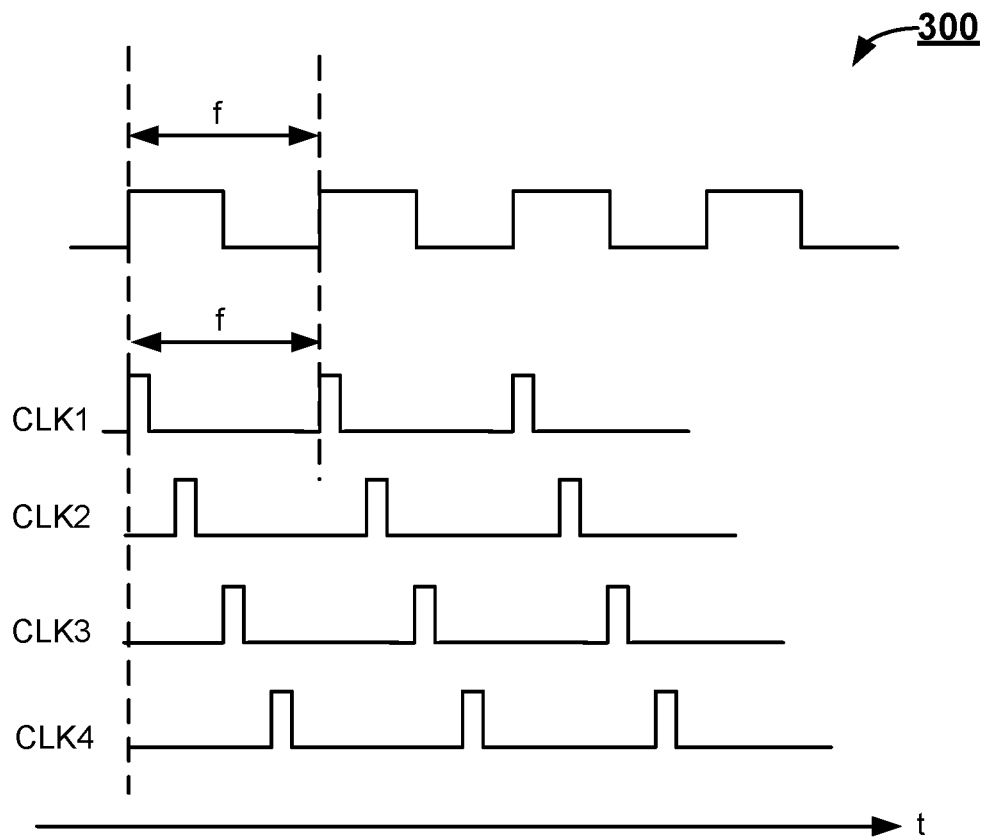
FIG. 3 illustrates a waveform diagram 300 of the plurality of the clock signals in accordance with an embodiment of the present invention.

FIG. 3 illustrates a waveform diagram 300 of a plurality of the clock signals in accordance with an embodiment of the present invention. In the exemplary embodiment of FIG. 3, four clock signals (CLK1, CLK2, CLK3, and CLK4) used for four channels multi-output DC-DC converter are illustrated. The waveform diagram 300 will be described with reference to the clock generator 200 of FIG. 2. The oscillator 301 may be configured to generate the master clock signal CLK having a frequency f. The phase shifter 302 may be configured to receive the master clock signal CLK to generate the first clock signal CLK1, the second clock signal CLK2, the third clock signal CLK3, and the fourth clock signal CLK4. The frequency f of the four clock signals (CLK1, CLK2, CLK3, and CLK4) is the same as the frequency f of the master clock signal CLK. The predetermined phase shift between the first clock signal CLK1 and the second clock signal CLK2 is 90 degrees, the predetermined phase shift between the second clock signal CLK2 and the third clock signal CLK3 is 90 degrees, the predetermined phase shift between the third clock signal CLK3 and the fourth clock signal CLK4 is 90 degrees, and the predetermined phase shift between the fourth clock signal CLK4 and the first clock signal CLK1 is 90 degrees, and so forth.

Figure 4:
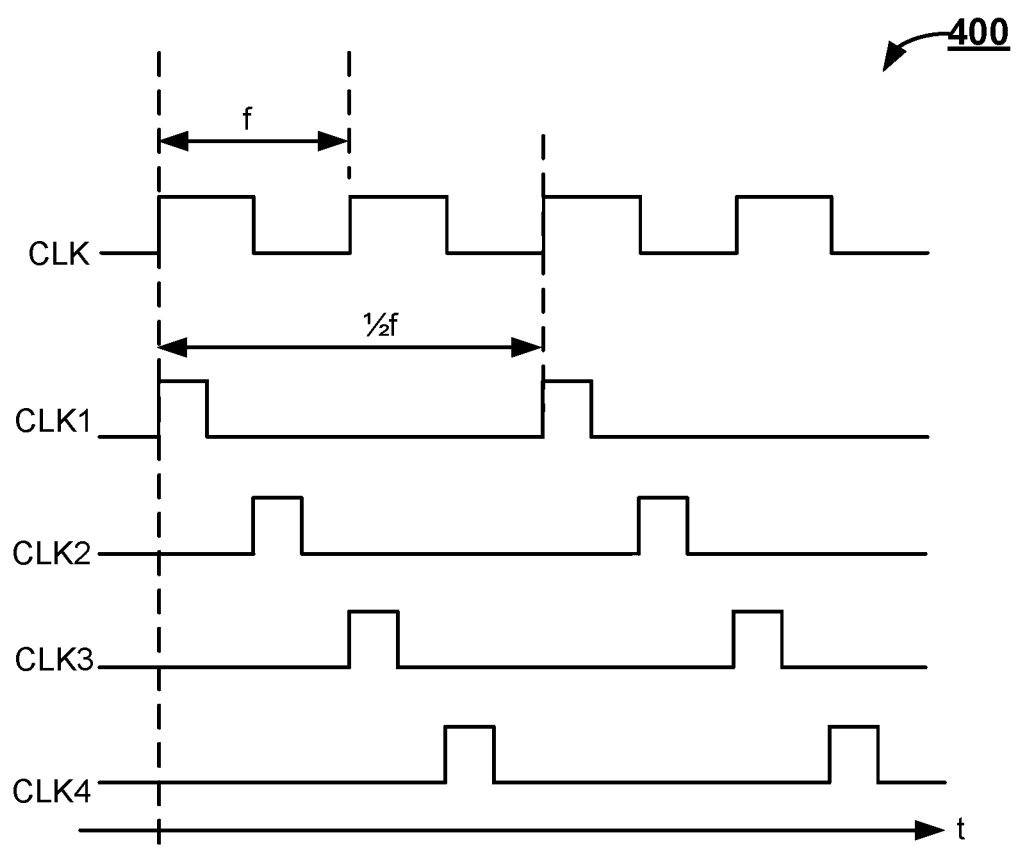
FIG. 4 illustrates a waveform diagram 300 of the plurality of the clock signals in accordance with an embodiment of the present invention.

FIG. 4 illustrates a waveform diagram 300 of the plurality of the clock signals in accordance with an embodiment of the present invention. Comparing with the embodiment of FIG. 3, the frequency of the four clock signals (CLK1, CLK2, CLK3, CLK4) of FIG. 4 is half of the frequency of the master clock signal CLK (labeled as ½ f) that is because the phase shifter 302 may further be configured to have a function of a frequency divider. In an embodiment, the clock generator 200 may comprise other suitable modules as long as these suitable modules can be used to generate the N clock signals (CLK1, CLK2, . . . , $CLK_N$) of which the frequency is the same as the switching frequency of the multi-output DC-DC converter 100 during the steady state.

Figure 5:
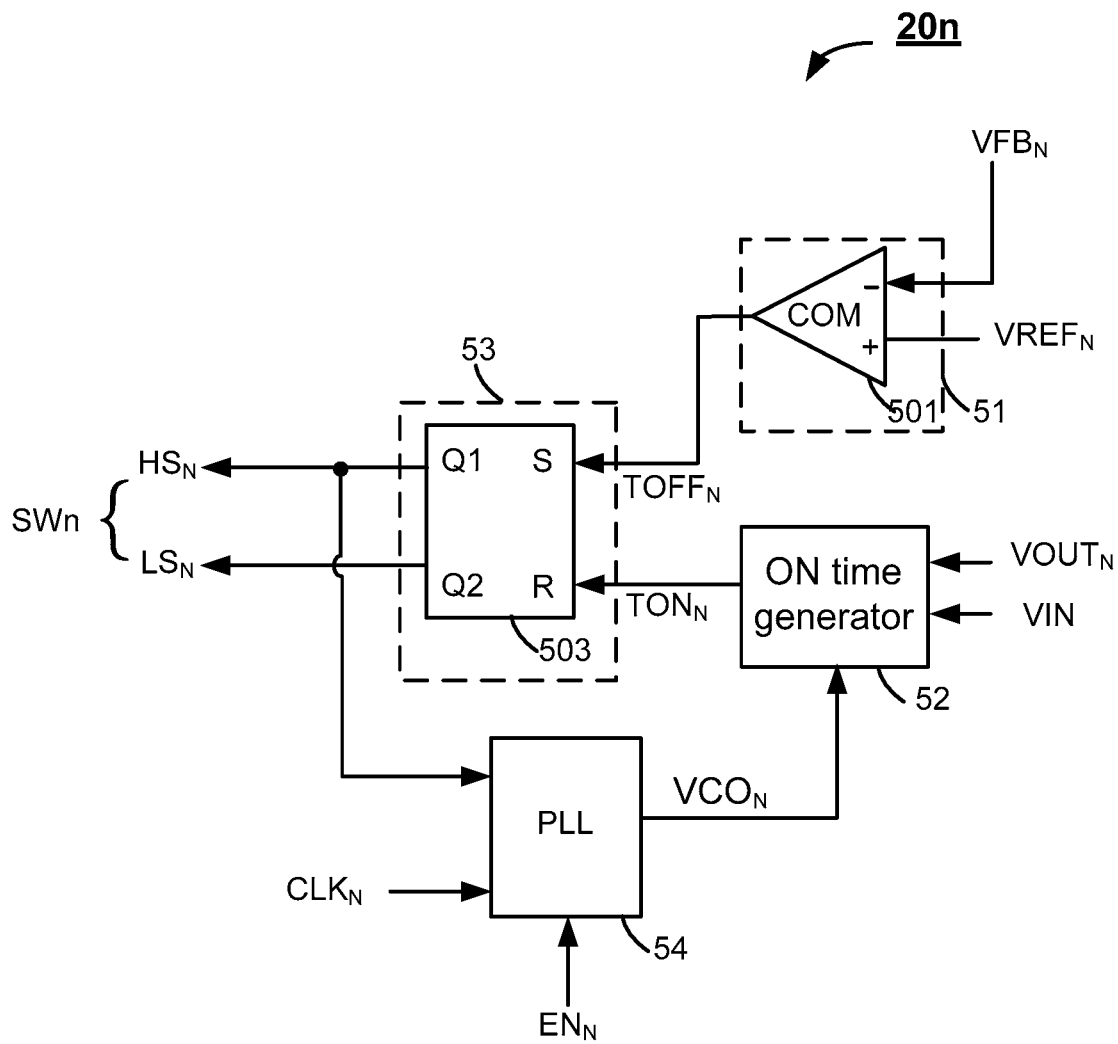
FIG. 5 schematically illustrates a COT controller $20_N$ in accordance with an embodiment of the present invention.

FIG. 5 schematically illustrates a COT controller $20_N$ in accordance with an embodiment of the present invention. As shown in FIG. 5, the COT controller $20_N$ may comprise an OFF time generator 51, an ON time generator 52, a logic circuit 53 and a Phase Locked Loop ("PLL") 54.

In the exemplary embodiment of FIG. 5, the OFF time generator 51 may be configured to receive the voltage feedback signal $VFB_N$ and a voltage reference signal $VREF_N$, and further configured to compare the voltage feedback signal $VFB_N$ with the voltage reference signal $VREF_N$ to generate an off time signal $TOFF_N$. In an embodiment, the off time signal $TOFF_N$ may comprise a logic signal with a logic high state and a logic low state. When the off time signal $TOFF_N$ is changed from the logic low state to the logic high state, the high-side switch is turned on. In an embodiment, the OFF time generator 51 may comprise a voltage comparator 501 having a non-inverting terminal configured to receive the voltage reference signal $VREF_N$, an inverting terminal configured to receive the feedback signal VFB$_N$. The voltage comparator 501 may be configured to compare the voltage feedback signal VFB$_N$ with the voltage reference signal VREF$_N$ to generate the off time signal TOFF$_N$. When the feedback signal VFB$_N$ is decreased to the voltage reference signal VREF$_N$, the off time signal TOFF$_N$ is changed from the logic low state to the logic high state so as to turn the high-side switch on.

In the exemplary embodiment of FIG. 5, the ON time generator 52 may be configured to receive the input voltage signal VIN, the output voltage signal VOUT$_N$, and an error signal VCO$_N$ to generate an on time signal TON$_N$. The on time signal TON$_N$ may comprise a logic signal with a logic high state and a logic low state. In an embodiment, when the on time signal TON$_N$ is changed from the logic low state to the logic high state, the high-side switch is turned off.

The logic circuit 53 may be configured to receive the off time signal TOFF$_N$ and the on time signal TON$_N$, and configured to conduct a logic operation to the off time signal TOFF$_N$ and the on time signal TON$_N$ to generate the control signal SW$_N$. In an embodiment, the logic circuit 53 may be illustrated as a RS flip-flop 503. The RS flip-flop 503 may comprise a set terminal S configured to receive the off time signal TOFF$_N$, a reset terminal R configured to receive the on time signal TON$_N$, a first output terminal Q1 and a second output terminal Q2. In an embodiment, the control signal SW$_N$ may comprise a high-side control signal HS$_N$ configured to control the high-side switch and the low-side control signal LS$_N$ configured to control the low-side switch. The RS flip-flop 503 may be configured to conduct a logic operation to the off time signal TOFF$_N$ and the on time signal TON$_N$ to generate the high-side control signal HS$_N$ at the first output terminal Q1 and the low-side control signal LS$_N$ at the second output terminal Q2.

The PLL 54 may be configured to receive the high-side control signal HS$_N$, the clock signal CLK$_N$, and an enable signal EN$_N$ to generate the error signal VCO$_N$. The enable signal EN$_N$ may be a logic signal with a logic high state and a logic low state. In an embodiment, the error signal VCO$_N$ is a voltage signal which is indicative of a phase shift between the high-side control signal HS$_N$ and the clock signal CLK$_N$. In the exemplary embodiment of FIG. 5, whereas the PLL 54 is illustrated to receive the high-side control signal HS$_N$, in another embodiment, the PLL 54 can be illustrated to receive the low-side control signal LS$_N$. For this condition, the error signal VCO$_N$ may be generated based on the low-side control signal LS$_N$, the clock signal CLK$_N$, and the enable signal EN$_N$. The enable signal EN$_N$ may be configured to enable/disable the PLL 54. When the enable signal EN$_N$ is in an active state, e.g., the logic high state, the PLL 54 is activated to operate. When the enable signal EN$_N$ is in an inactive state, e.g., the logic low state, the PLL 54 is unable to operate.

Figure 6:
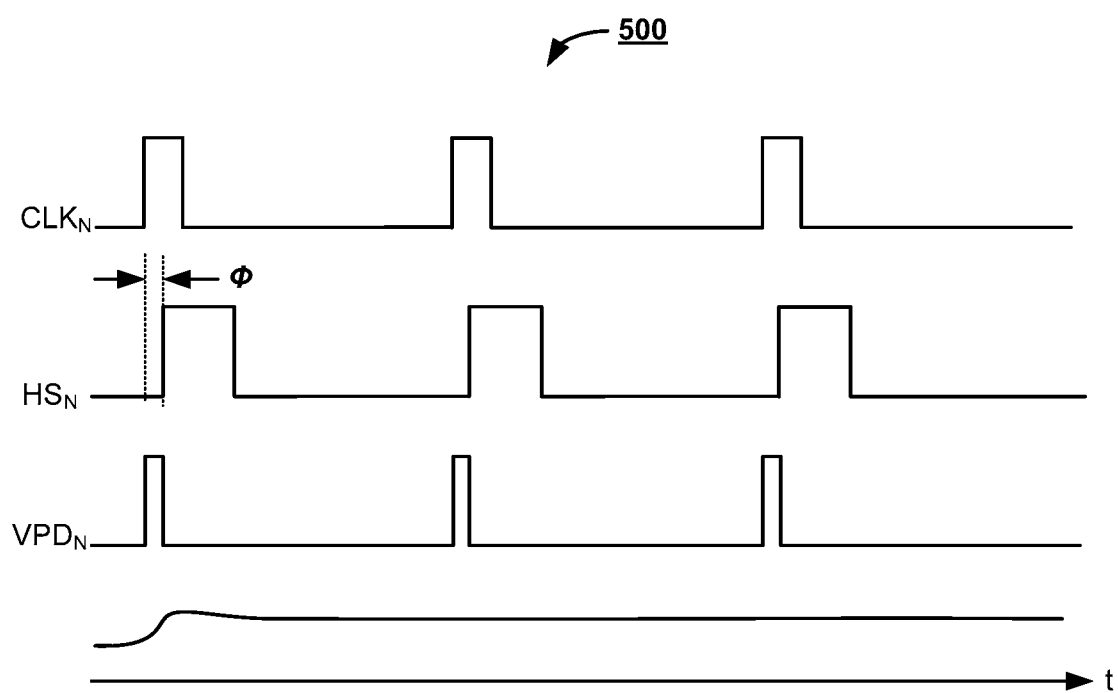
FIG. 6 illustrates an operation waveform diagram 500 illustrating operation of the PLL 54 in accordance with an embodiment of the present invention.

FIG. 6 illustrates an operation waveform diagram 500 illustrating operation of the PLL 54 in accordance with an embodiment of the present invention. As shown in FIG. 6, the diagram 500 illustrates the clock signal CLK$_N$, the high-side control signal HS$_N$, a phase shift signal VPD$_N$ and the error signal VCO$_N$ from top-to-bottom. The phase shift signal VPD$_N$ is indicative of the phase shift between the clock signal CLK$_N$ and the high-side control signal HS$_N$, and the pulse-width of the phase shift signal VPD$_N$ is labeled as Φ. The value of the error signal VCO$_N$ is varied with the change in the pulse-width Φ of the phase shift signal VPD$_N$.

Figure 7:
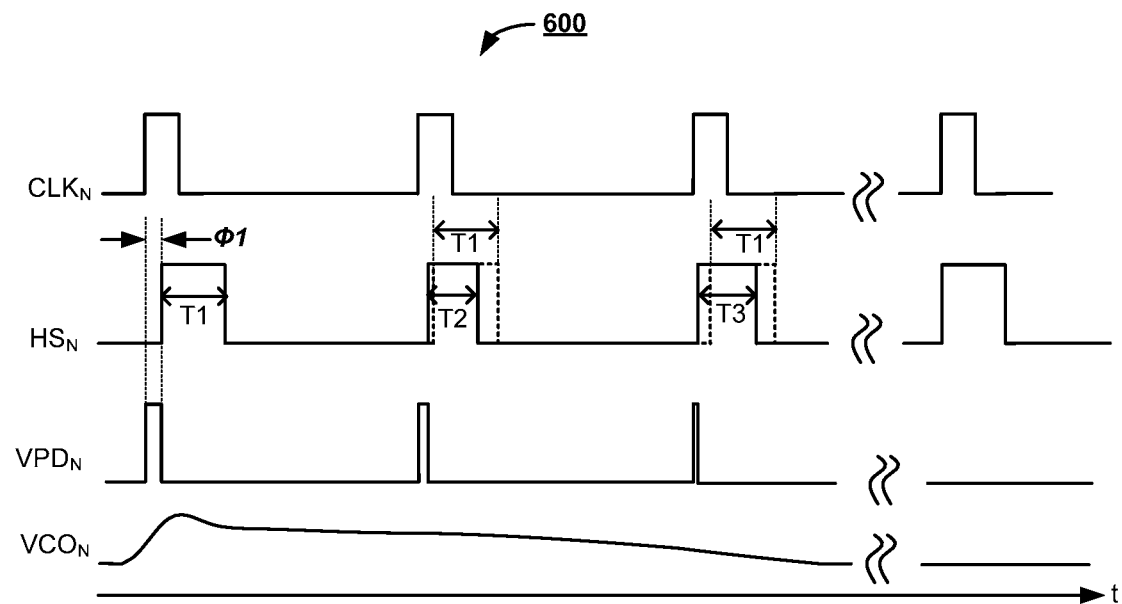
FIG. 7 illustrates an operation waveform diagram 600 illustrating operation of the PLL 54 in accordance with an embodiment of the present invention.

FIG. 7 illustrates an operation waveform diagram 600 illustrating operation of the PLL 54 in accordance with an embodiment of the present invention. As shown in FIG. 7, the diagram 600 illustrates the clock signal CLK$_N$, the high-side control signal HS$_N$, the phase shift signal VPD$_N$ and the error signal VCO$_N$ from top-to-bottom. The waveform diagram 600 would be described with reference to FIG. 5. When the phase of the high-side control signal HS$_N$ lags off the phase of the clock signal CLK$_N$ (the phase shift is illustrated as Φ1), the value of the error signal VCO$_N$ is increased. The ON time generator 52 may be configured to reduce the on time of the high-side switch in response of the increase of the error signal VCO$_N$. Specifically, the width of the logic high state of the on time signal TON$_N$ is reduced from T1 to T2 (T2<T1), thus, as shown in FIG. 7, the width of the logic high state of the high-side control signal HS$_N$ is reduced from T1 to T2. In order to maintain a constant duty cycle of the on time signal TON$_N$, the next rising edge of the high-side control signal HS$_N$ will be early arrival, i.e., the next rising edge of the high-side control signal HS$_N$ will be closer to the next rising edge of the signal CLK$_N$. Following the next cycle, since the phase shift Φ1 is smaller than that of the previous cycle, the value of the phase shift signal VPD$_N$ is decreased. Thus, the value of the error signal VCO$_N$ is decreased so that the width of the logic high state of the on time signal TON$_N$ is increased from T2 to T3 (T2<T3<T1). After several cycles, the high-side control signal HS$_N$ may be synchronized with the clock signal CLK$_N$. In FIG. 7, though the high-side control signal HS$_N$ is illustrated to be synchronized with the clock signal CLK$_N$ after two cycles regulation, it is obvious to one of ordinal skill in the art that two cycles are illustratively, and more than two cycles are needed in the practical operation.

Figure 8:
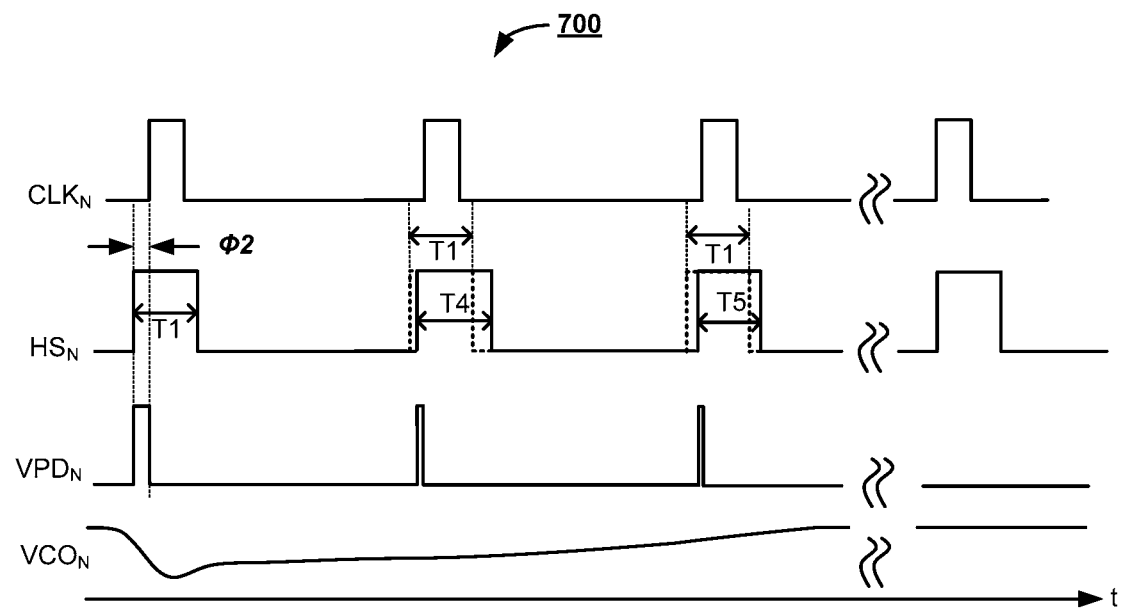
FIG. 8 illustrates an operation waveform diagram 700 illustrating operation of the PLL 54 in accordance with an embodiment of the present invention.

FIG. 8 illustrates an operation waveform diagram 700 illustrating operation of the PLL 54 in accordance with an embodiment of the present invention. As shown in FIG. 8, the diagram 700 illustrates the clock signal CLK$_N$, the high-side control signal HS$_N$, the phase shift signal VPD$_N$ and the error signal VCO$_N$ from top-to-bottom. The operation principle of the PLL 54 would be described with reference to FIG. 5. When the phase of the high-side control signal HS$_N$ goes ahead of the phase of the clock signal CLK$_N$ (the phase shift is illustrated as Φ2), the value of the error signal VCO$_N$ is decreased. The ON time generator 52 may be configured to decrease the on time of the high-side switch in response of the decrease of the error signal VCO$_N$. Specifically, the width of the logic high state of the on time signal TON$_N$ is reduced from T1 to T4 (T4>T1), thus, as shown in FIG. 8, the width of the logic high state of the high-side control signal HS$_N$ is increased from T1 to T4. In order to maintain the constant duty cycle of the on time signal TON$_N$, the next rising edge of the high-side control signal HS$_N$ will be delay, i.e., the next rising edge of the high-side control signal HS$_N$ will be closer to the next rising edge of the signal CLK$_N$. Following the next cycle, since the phase shift Φ2 is smaller than that of the previous cycle, the value of the phase shift signal VPD$_N$ is increased. Thus, the value of the error signal VCO$_N$ is increased so that the width of the logic high state of the on time signal TON$_N$ is decreased from T4 to T5 (T1<T5<T4). After several cycles, the high-side control signal HS$_N$ may be synchronized with the clock signal CLK$_N$. In FIG. 8, though the high-side control signal HS$_N$ is illustrated to be synchronized with the clock signal CLK$_N$ after two cycles regulation, it is obvious to one of ordinal skill in the art that two cycles are illustratively, and more than two cycles are needed in the practical operation.

Figure 9:
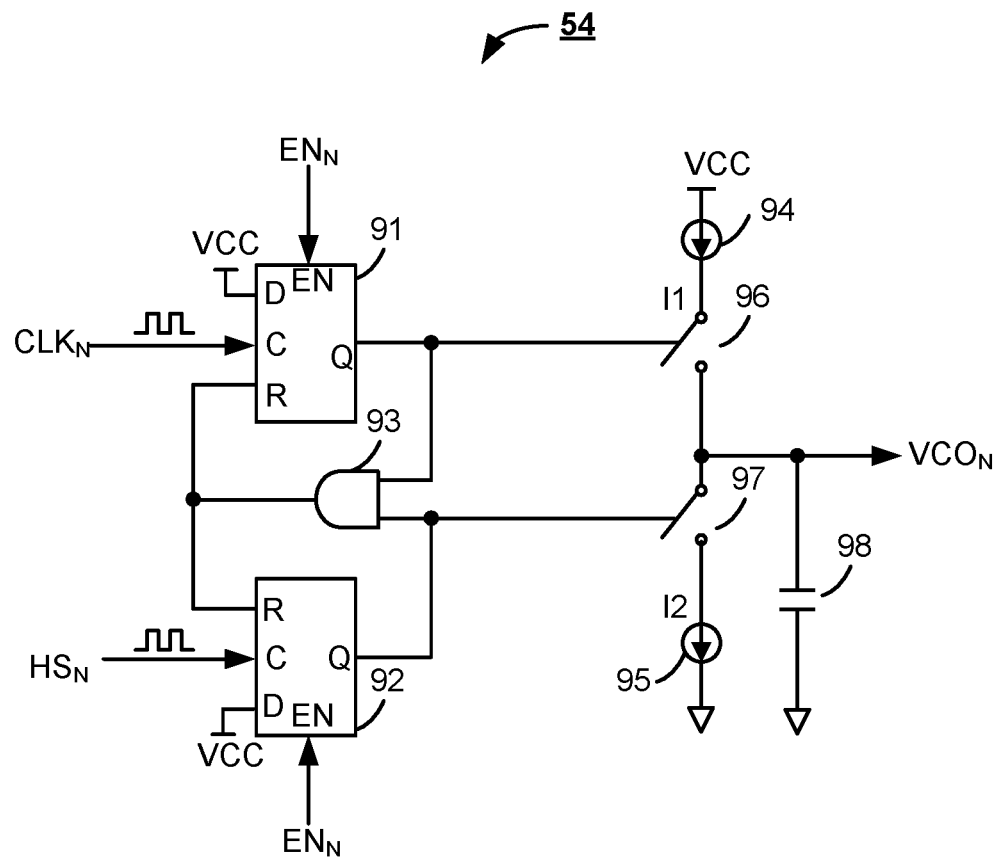
FIG. 9 schematically illustrates the PLL 54 of FIG. 5 in accordance with an embodiment of the present invention.

FIG. 9 schematically illustrates the PLL 54 of FIG. 5 in accordance with an embodiment of the present invention. As shown in FIG. 9, the PLL 54 may comprise a first D flip-flop 91, a second D flip-flop 92, an AND gate 93, a first current source 94, a second current source 95, a first switch 96, a second switch 97 and a capacitor 98. The first D flip-flop 91 and the second D flip-flop 92 respectively have a first terminal D, a second terminal C, a third terminal R, an enable terminal EN and an output terminal Q. The first terminals D of the first D flip-flop 91 and the second D flip-flop 92 may be configured to receive a supply voltage signal VCC. The second terminal C of the first D flip-flop 91 may be configured to receive the clock signal $CLK_N$. The second terminal C of the second D flip-flop 92 may be configured to receive the high-side control signal $HS_N$. The third terminals R of the first D flip-flop 91 and second D flip-flop 92 may be coupled together. The enable terminals EN of the first D flip-flop 91 and the second D flip-flop 92 may be configured to receive the enable signal $EN_N$. When the enable signal $EN_N$ is in the active state, the first D flip-flop 91 and second D flip-flop 92 are activated to operate. In the exemplary embodiment of FIG. 9, the second terminal C of the first D flip-flop 91 is operated as the first input terminal of the PLL 54, and the second terminal C of the second D flip-flop 92 is operated as the second input terminal of the PLL 54. The AND gate 93 may have a first input terminal coupled to the output terminal Q of the first D flip-flop 91, a second input terminal coupled to the output terminal Q of the second D flip-flop 92, an output terminal coupled to the third input terminals R of the first D flip-flops 91 and the second D flip-flops 92. The first switch 96 and the second switch 97 may respectively comprise a first terminal, a second terminal and a control terminal. The first terminals of the first switch 96 and the second switch 97 are coupled together. The control terminal of the first switch 96 may be coupled to the output terminal Q of the first D flip-flop 91. The control terminal of the second switch 97 may be coupled to the output terminal Q of the second D flip-flop 92. In an embodiment, the first switch 96 and the second switch 97 may comprise transistors, for example, the first switch 96 is a P-transistor and the second switch 97 is an N-transistor. The first current source 94 may be coupled between the second terminal of the first switch 96 and the supply voltage VCC. The second current source 95 may be coupled between the second terminal of the second switch 97 and a logic ground. The capacitor 98 may be coupled between the logic ground and the first terminals of the first switch 96 and the second switch 97. In an embodiment, the first current source 94 is configured to charge the capacitor 98 when the first switch 96 is turned on, and the second current source 95 is configured to discharge the capacitor 98 when the second switch 97 is turned on. The common connection of the capacitor 98 and the first terminals of the first switch 96 and the second switch 97 may be operated as the output terminal of the PLL 54, and the voltage across the capacitor 98 is operated as the error signal $VCO_N$.

Figure 10:
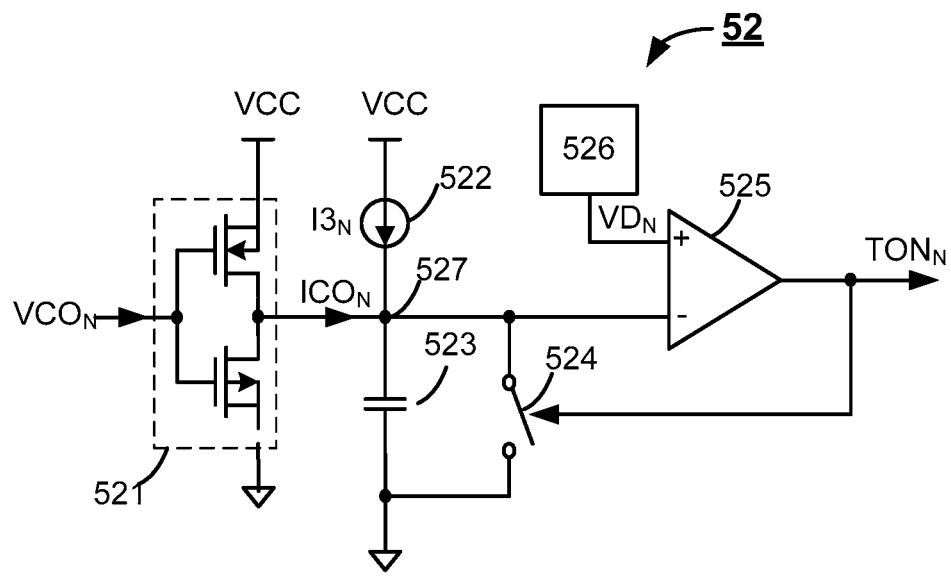
FIG. 10 schematically illustrates the ON time generator 52 of FIG. 5 in accordance with an embodiment of the present invention.

FIG. 10 schematically illustrates the ON time generator 52 of FIG. 5 in accordance with an embodiment of the present invention. In the exemplary embodiment of FIG. 10, the ON time generator 52 may comprise a push-pull circuit 521, a controlled current source 522, a capacitor 523, and a reset switch 524, a charge comparator 525 and a controlled voltage signal generator 526.

In the exemplary embodiment of FIG. 10, the push-pull circuit 521 may be configured to receive the error signal $VCO_N$ to generate a compensation current signal $ICO_N$. The capacitor 523 and the controlled current source 522 which is configured to provide a charging current signal $I3_N$ may be connected in series between the supply voltage VCC and the logic ground. A common node 527 of the controlled current source 522 and the capacitor 523 may be coupled to an output terminal of the push-pull circuit 521. The reset switch 524 may be coupled between the common node 527 and the logic ground. The controlled voltage signal generator 526 may be configured to generate a controlled voltage signal $VD_N$. The charge comparator 525 may have a first input terminal configured to receive the controlled voltage signal $VD_N$, a second input terminal coupled to the common node 527 to receive the voltage across the capacitor 523, and an output terminal. The charge comparator 525 may be configured to compare the controlled voltage signal $VD_N$ and the voltage across the capacitor 523 to generate the on time signal $TON_N$.

In an embodiment, when the switching circuit $10_N$ is illustrated to have a BUCK topology, the duty cycle of the on time signal $TON_N$ is proportional to the output voltage signal $VOUT_N$, and inversely proportional to the input voltage signal VIN. In another embodiment, when the N switching circuit $10_N$ is illustrated to have a BOOST topology, the duty cycle of the on time signal $TON_N$ is proportional to the difference of the output voltage signal $VOUT_N$ and the input voltage signal VIN, i.e., $VOUT_N$-VIN, and inversely proportional to the output voltage signal $VOUT_N$.

In an embodiment, when the switching circuit $10_N$ is illustrated to have a BUCK topology, the charging current signal $I3_N$ is proportional to the input voltage signal VIN, the controlled voltage signal $VD_N$ is proportional to the output voltage signal $VOUT_N$. In another embodiment, when the switching circuits $10_N$ is illustrated to have a BOOST topology, the charging current signal $I3_N$ is proportional to the output voltage signal $VOUT_N$, and the controlled voltage signal $VD_N$ is proportional to the difference of the output voltage signal $VOUT_N$ and the input voltage signal VIN, i.e., $VOUT_N$-VIN.

Figure 11:
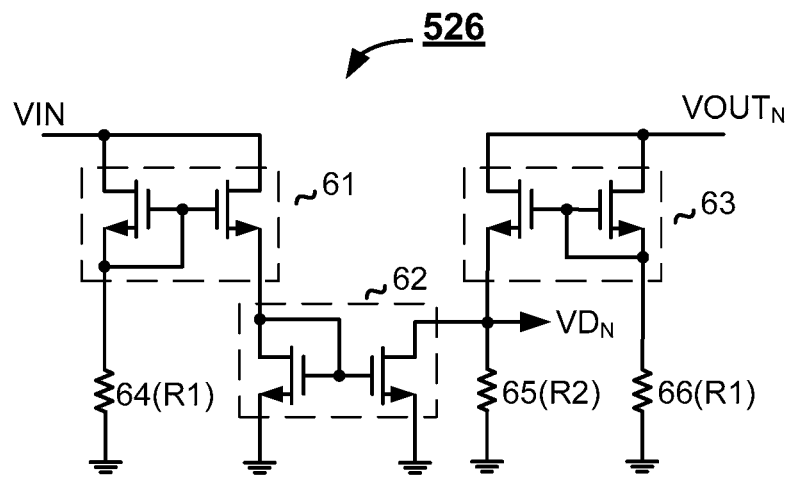
FIG. 11 schematically illustrates the controlled voltage signal generator 526 of FIG. 10 in accordance with an embodiment of the present invention.

FIG. 11 schematically illustrates the controlled voltage signal generator 526 of FIG. 10 in accordance with an embodiment of the present invention. In the exemplary embodiment of FIG. 11, the schematic diagram of the controlled voltage signal generator 526 is illustrated based on the BOOST topology that the switching circuit $10_N$ is illustrated to have.

In the exemplary embodiment of FIG. 11, the controlled voltage signal generator 526 may comprise a first pull-up current mirror 61 having an input terminal, a first current terminal and a second current terminal, wherein the input terminal is configured to receive the input voltage signal VIN, and the first current terminal is coupled to a resistor 64 with resistance of R1; a second pull-down current mirror 62 having a current-in end and a current-out end, wherein the current-in end may be coupled to the second current terminal of the first pull-up current mirror 61; and a second pull-up current mirror 63 having an input terminal, a first current terminal and a second current terminal, wherein the input terminal is configured to receive the output voltage signal $VOUT_N$, the first current terminal is coupled to the current-out end of the pull-down current mirror 62 and to a resistor 65 with resistance of R2, and the second current terminal is coupled to a resistor 66 with resistance of R1. A voltage across the resistor 65 is operated as the controlled voltage signal $VD_N$. Thus, the controlled voltage signal $VD_N$ in FIG. 11 has a relationship with the input voltage VIN and the output voltage $VOUT_N$ as follow:

$$VD_N = \frac{(VOUT_N - VIN) \times R2}{R1}$$

Figure 12:
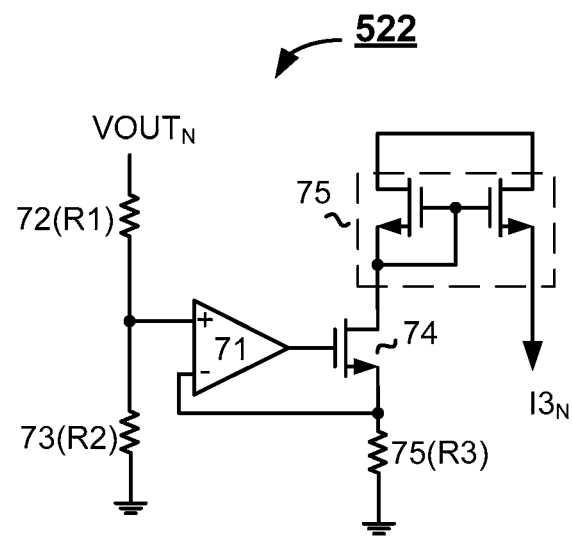
FIG. 12 schematically illustrates the controlled current source 522 of FIG. 10 in accordance with an embodiment of the present invention.

FIG. 12 schematically illustrates the controlled current source 522 of FIG. 10 in accordance with an embodiment of the present invention. In the exemplary embodiment of FIG.

12, the schematic diagram of the controlled current source 522 is illustrated based on the BOOST topology that the switching circuit $10_N$ is illustrated to have.

In the exemplary embodiment of FIG. 12, the controlled current source 522 may comprise an operational amplifier 71 having a first input terminal, a second input terminal and an output terminal, wherein the first input terminal is configured to receive the input voltage VIN through a resistor 72 with resistance R1, and coupled to the logic ground through a resistor 73 with resistance R2, and the second input terminal is coupled to the output terminal through a transistor 74, and coupled to the logic ground through a resistor 75 with resistance R3; and a third pull-up current mirror 76 having a current-in end and a current-out end, wherein the current-in end is coupled to the transistor 74, and the current-out end is configured to provide the controlled current signal $I3_N$. Thus, the controlled current signal $I3_N$ in FIG. 12 has a relationship with the output voltage $VOUT_N$ as follow:

$$I3_N = \frac{VOUT_N \times R2}{(R1 + R2) \times R3}$$

Whereas the embodiments of FIGS. 11-12 only describe the controlled voltage signal generator 526 and the controlled current source 522 based on the BOOST topology that the switching circuit $10_N$ may be illustrated to have, the controlled voltage signal generator 526 and the controlled current source 522 based on the BOOST topology that the switching circuit $10_N$ may be illustrated to have can be easily obtained through a amendment. For the sake of simplicity, it will not be described again.

Figure 13:
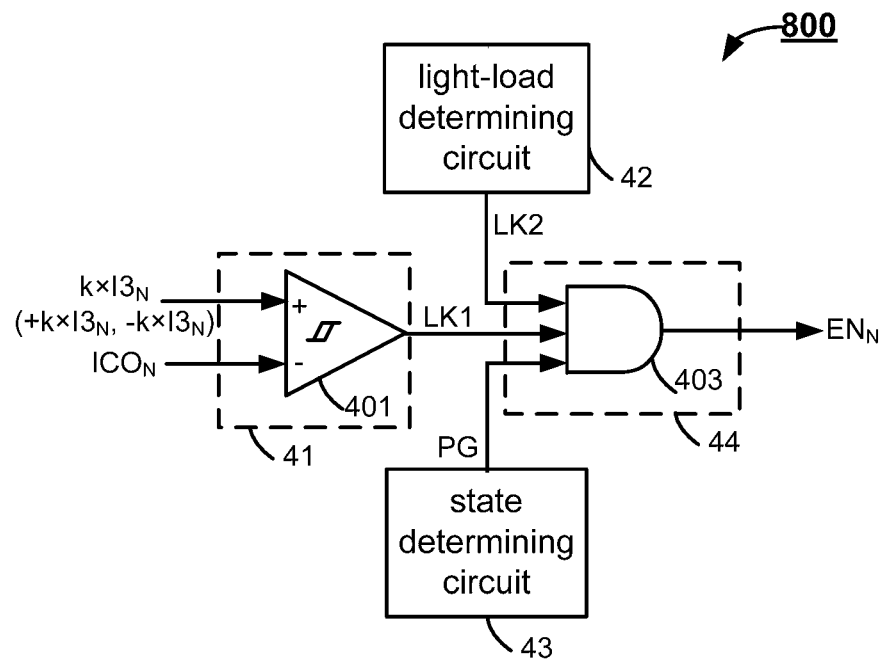
FIG. 13 schematically illustrates an enable signal generator 800 in accordance with an embodiment of the present invention.

FIG. 13 schematically illustrates an enable signal generator 800 in accordance with an embodiment of the present invention. The enable signal generator 800 may be configured to generate the enable signal $EN_N$ described in the embodiments of FIGS. 5 and 9. In an embodiment, when the enable signal $EN_N$ is in the logic high state, the PLL 54 is activated to operate; and when the enable signal $EN_N$ is in the logic low state the PLL 54 is inactivated to operate. As shown in FIG. 13, the enable signal generator 800 may comprise a clamping circuit 41, a light-load determining circuit 42, a state determining circuit 43 and a logic circuit 44.

In the exemplary embodiment of FIG. 13, the clamping circuit 41 may be configured to generate a first clamping signal LK1 which may be used for controlling a range of a reference phase shift between the clock signal $CLK_N$ and the high-side control signal $HS_N$. The first clamping signal LK1 is a logic signal having a logic high state and a logic low state. In an embodiment, the logic high state of the first clamping signal LK1 is regarded as an active state, and the logic low state of the first clamping signal LK1 is regarded as an active state. Generally, when the phase shift between the clock signal $CLK_N$ and the high-side control signal $HS_N$ is larger than the reference phase shift (e.g., 120 degrees), the first clamping signal LK1 is in the inactive state (e.g., logic low) resulting that the enable signal $EN_N$ may disable the PLL 54.

In an embodiment, the clamping circuit 41 may comprise a hysteresis comparator 401 having a first input terminal configured to receive a current reference signal $k \times I3_N$, a second input terminal configured to receive the compensation current signal $ICO_N$, and an output terminal, wherein k is a proportional coefficient, e.g., of 0.3. The hysteresis comparator 401 is configured to compare the current reference signal $k \times I3_N$ and the compensation current signal $ICO_N$ to generate the first clamping signal LK1 at the output terminal of the hysteresis comparator 401. The current reference signal $k \times I3_N$ is configured to set a reference range of the compensation current signal $ICO_N$. When the compensation current signal $ICO_N$ is changed within the range of the $-k \times I3_N \sim k \times I3_N$, the phase shift between the clock signal $CLK_N$ and the high-side control signal $HS_N$ is smaller than the reference phase shift. For this condition, the first clamping signal LK1 is in the active state (e.g., logic high), and the enable signal $EN_N$ may enable the PLL 54. When the compensation current signal $ICO_N$ is changed exceeded the range of the $-k \times I3_N \sim k \times I3_N$, the phase shift between the clock signal $CLK_N$ and the high-side control signal $HS_N$ is larger than the reference phase shift. For this condition, the first clamping signal LK1 is in the inactive state (e.g., logic low), and the enable signal $EN_N$ may disable the PLL 54.

In the exemplary embodiment of FIG. 13, the light-load determining circuit 42 may be configured to generate a second clamping signal LK2 which is indicative of an operation condition of the multi-output DC-DC converter 100. The second clamping signal LK2 is a logic signal having a logic high state and a logic low state. In an embodiment, the logic high state of the second clamping signal LK2 is regarded as an active state, and the logic low state of the second clamping signal LK2 is regarded as an active state. When the multi-output DC-DC converter 100 is operated in a light-load condition, the switching frequency of the multi-output DC-DC converter 100 is much smaller than the switching frequency in a normal-load condition, and the PLL is unable to operate. In an embodiment, when the multi-output DC-DC converter 100 is operated in the normal-load condition, the second clamping signal LK2 is in the active state (e.g., logic high), and the enable signal $EN_N$ may enable the PLL 54. When the multi-output DC-DC converter 100 is operated in a light-load condition, the second clamping signal LK2 is in the inactive state (e.g., logic high), and the enable signal $EN_N$ may disable the PLL 54.

In the exemplary embodiment of FIG. 13, the state determining circuit 43 is configured to generate a state signal PG which is indicative of the operation state of the multi-output DC-DC converter 100. The state signal PG is a logic signal with a logic state and a logic low state. In an embodiment, the logic high state of the state signal PG is regarded as an active state, and the logic low state of the state signal PG is regarded as an active state. In an embodiment, when the state signal PG is in the active state (e.g., logic high), the enable signal $EN_N$ may enable the PLL 54. When the state signal PG is in the inactive state (e.g., logic high), and the enable signal $EN_N$ may disable the PLL 54.

In an embodiment, the state determining circuit 43 may be configured to receive a soft-start signal to provide the state signal PG. When the soft-start signal PG indicates that the multi-output DC-DC converter 100 is completed the soft-start operation and is operated in a normal node, the state signal PG is active. When the soft-start signal PG indicates that the multi-output DC-DC converter 100 is still operated in the soft start condition, the state signal PG is inactive.

In an embodiment, the state determining circuit 43 may comprise a current monitoring circuit which is configured to monitor one or more current signals of the multi-output DC-DC converter 100. When the current monitoring circuit indicates that the multi-output DC-DC converter 100 may be in an over-current condition, the state signal PG is in the active state.

In an embodiment, the state determining circuit 43 may further comprise other monitoring circuits, e.g., a temperature monitoring circuit, an over-voltage monitoring circuit, etc. In summary, the PLL 54 is activated to operate only when the multi-output DC-DC converter 100 is normally operated.

Figure 14:
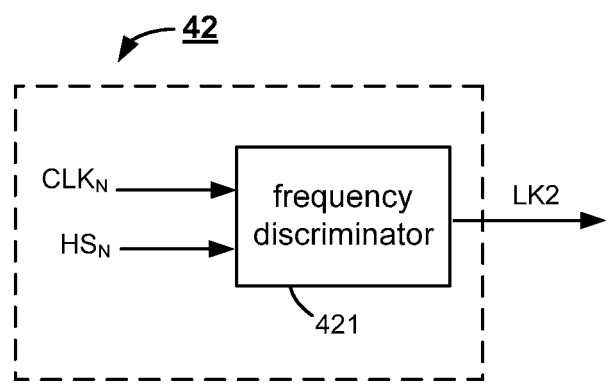
FIG. 14 schematically illustrates the light-load determining circuit 42 of FIG. 13 in accordance with an embodiment of the present invention.

FIG. 14 schematically illustrates the light-load determining circuit 42 of FIG. 13 in accordance with an embodiment of the present invention. As shown in FIG. 14, the light-load determining circuit 42 may comprise a frequency discriminator 421. The frequency discriminator 421 has a first input terminal configured to receive the clock signal $CLK_N$, a second input terminal configured to receive the high-side control signal $HS_N$, and an output terminal. The frequency discriminator 421 may be configured to compare the frequency of the clock signal $CLK_N$ and the frequency of the high-side control signal $HS_N$ to generator the second clamping signal LK2 at the output terminal of the frequency discriminator 421. When the frequency of the high-side control signal $HS_N$ is lower than a proportionality coefficient (e.g., 60%) of the frequency of the clock signal $CLK_N$, the second clamping signal LK2 is in the inactive state.

Figure 15:
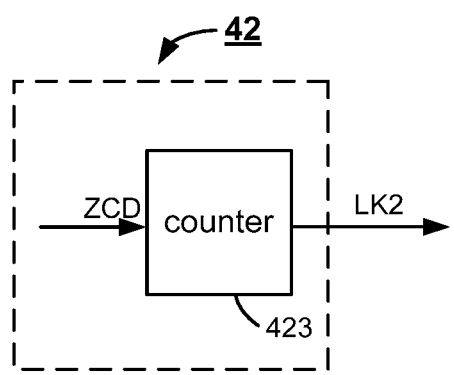
FIG. 15 schematically illustrates the light-load determining circuit 42 of FIG. 13 in accordance with an embodiment of the present invention.

FIG. 15 schematically illustrates the light-load determining circuit 42 of FIG. 13 in accordance with an embodiment of the present invention. As shown in FIG. 15, the light-load determining circuit 42 may comprise a counter 423 configured to receive a zero-cross signal ZCD, e.g., a zero-cross current signal flowing through the low-side switch. In an embodiment, the zero-cross signal ZCD is a logic signal having a logic high state and a logic low state. When the zero-cross signal ZCD is in the inactive state (e.g., the logic high state), the current flowing through the low-side switch is zero. For example, it could be understood that when the switching circuit $10_N$ is illustrated to have a BUCK topology and is operated in a discontinue current mode, the low-side switch may be turned off once the zero-cross signal ZCD is in the logic high state. The counter 423 is configured to count the quantities of the rising edge (or the falling edge) of the zero-cross signal ZCD. When the quantities of the rising edge (or the falling edge) of the zero signal ZCD reaches a certain value, the second clamping signal LK2 is inactive.

It should be note that, in the embodiments of FIGS. 5-15, the high-side control signal $HS_N$ is adopted as an illustrative example of the control signal $SW_N$, one of ordinary skill could be understood that the low-side control signal $LS_N$ is also can be adopted to realize the control of the embodiments of the present invention.

Figure 16:
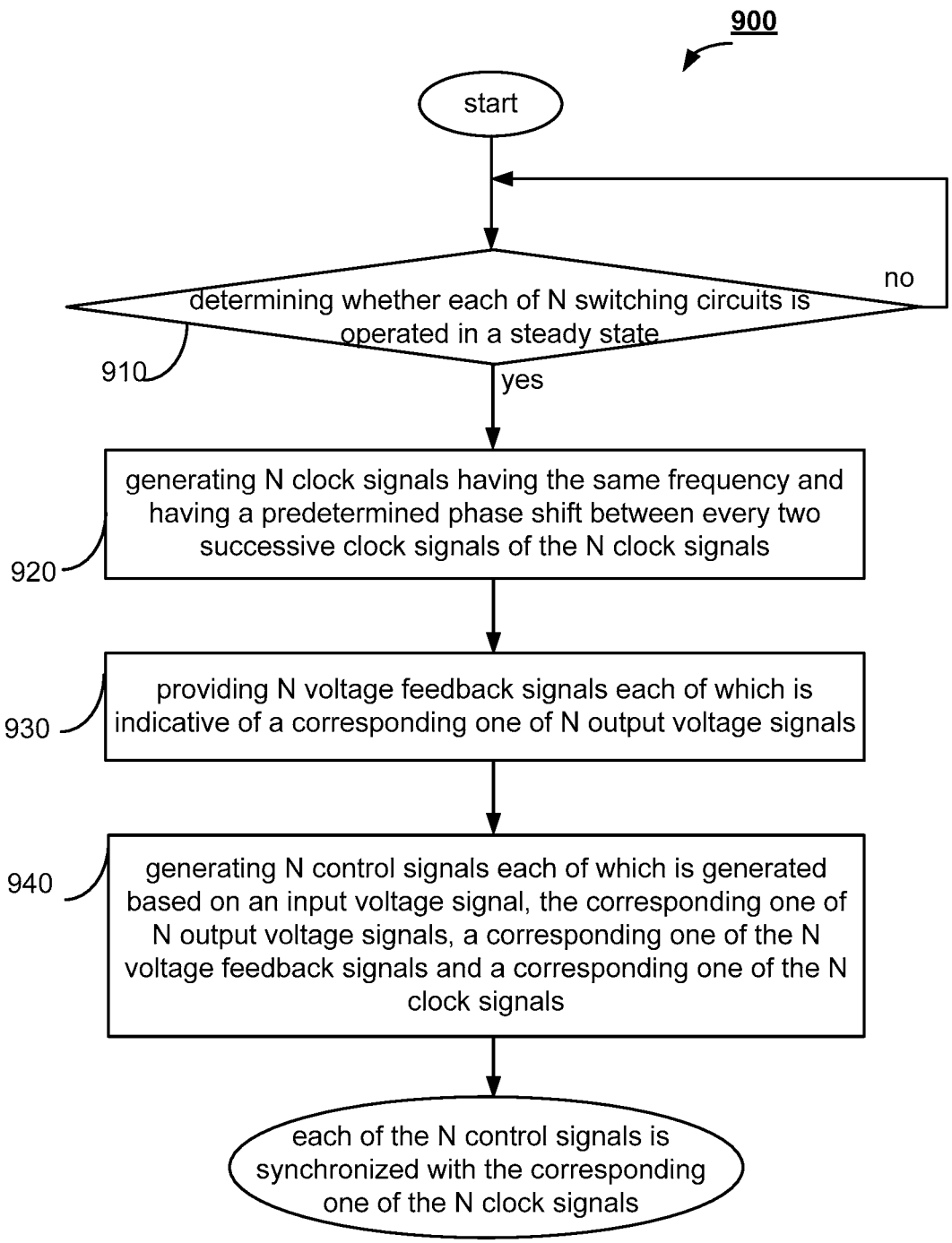
FIG. 16 illustrates a COT control method 900 for a multi-output DC-DC converter in accordance with an embodiment of the present invention.

FIG. 16 illustrates a COT control method 900 for a multi-output DC-DC converter in accordance with an embodiment of the present invention. The control method 900 can be carried out in the multi-output DC-DC converter 100 of FIG. 1.

As mentioned above, the multi-output DC-DC converter 100 may comprise an input signal VIN and N output voltage signals (VOUT1, VOUT2, . . . , $VOUT_N$), wherein N is an integer larger than or equal to 2. The multi-output DC-DC converter 100 may further comprise N switching circuits (101, 102, . . . , $10_N$) and N COT controller (201, 202, . . . , $20_N$), wherein each of the N COT controller (201, 202, . . . , $20_N$) is configured to control the corresponding one of the N switching circuits (101, 102, . . . , $10_N$). The N switching circuits (101, 102, . . . , $10_N$) is configured to receive the input voltage signal VIN and further configured to convert the input voltage signal to N output voltage signals respectively. Each of the N switching circuits (101, 102, . . . , $10_N$) may comprise at least one controllable switch. The COT control method 900 may comprise steps 910-940.

In step 910, determining whether each of the N switching circuits (101, 102, . . . , $10_N$) is operated in a steady state. In an embodiment, the enable signal generator 800 of FIG. 13 can be used to determine whether each of the N switching circuits (101, 102, . . . , $10_N$) is operated in a steady state. If each of the N switching circuits (101, 102, . . . , $10_N$) is operated in the steady state, turns to step 920, otherwise, continues to step 910. The steady state of the N switching circuits (101, 102, . . . , $10_N$) indicates that both the input voltage signal VIN and the load of each of the N switching circuits (101, 102, . . . , $10_N$) are invariable.

In step 920, generating N clock signals (CLK1, CLK2, . . . , $CLK_N$), wherein the N clock signals (CLK1, CLK2, . . . , $CLK_N$) have the same frequency as the switching frequency of the multi-output DC-DC converter 100, and have a predetermined phase shift between every two successive clock signals of the N clock signals (CLK1, CLK2, . . . , $CLK_N$). In an embodiment, the clock generator of FIG. 2 can be used to generating the N clock signals (CLK1, CLK2, . . . , $CLK_N$).

In step 930, providing N voltage feedback signals (VFB1, VFB2, . . . , $VFB_N$). Each of the N voltage feedback signals (VFB1, VFB2, . . . , $VFB_N$) is indicative of a corresponding one of the N output voltage signals (VOUT1, VOUT2, . . . , $VOUT_N$).

In step 940, generating N control signals (SW1, SW2, . . . , $SW_N$). Each of the N control signals (SW1, SW2, . . . , $SW_N$) is generated based on the input voltage signal VIN, the corresponding one of the output voltage signals (VOUT1, VOUT2, . . . , $VOUT_N$), the corresponding one of the N voltage feedback signals (VFB1, VFB2, . . . , $VFB_N$), and the corresponding one of the N clock signals (CLK1, CLK2, . . . , $CLK_N$). Each of the N control signals (SW1, SW2, . . . , $SW_N$) is configured to control the at least one controllable switch of the corresponding one of the N switching circuits (101, 102, . . . , $10_N$) correspondingly.

In an embodiment, generating one of the N control signals (SW1, SW2, . . . , $SW_N$) may further comprise steps 941-944.

Figure 17:
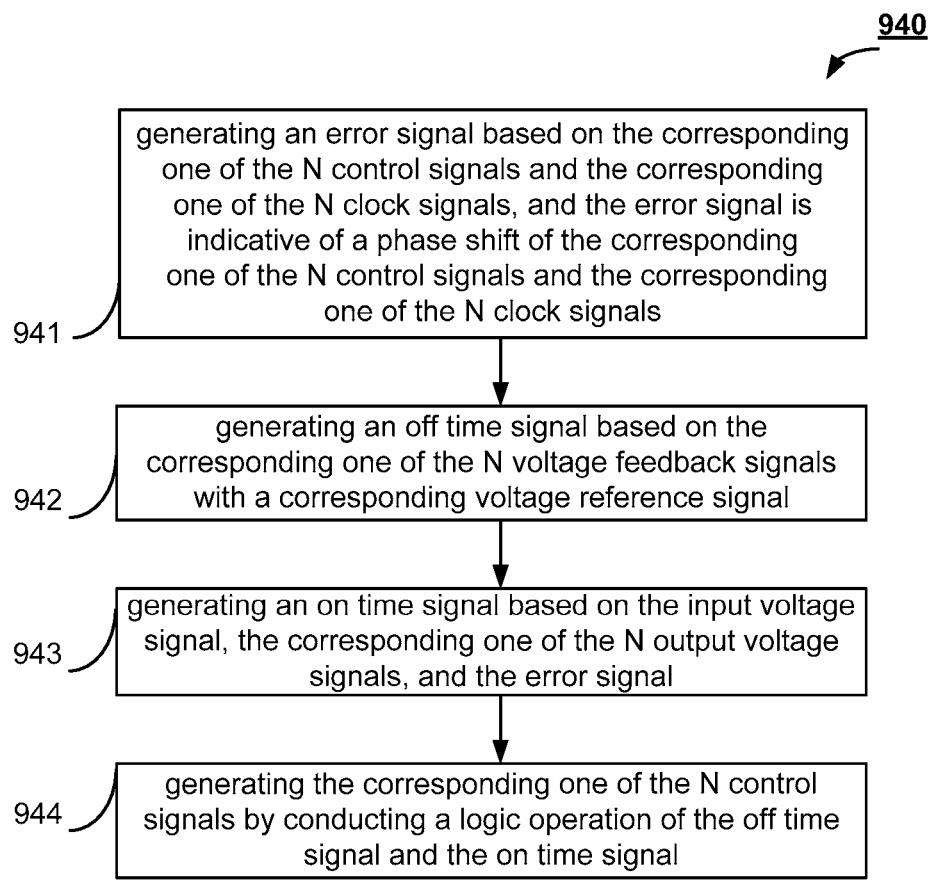
FIG. 17 illustrates a method step 940 of generating a control signal of the COT control method 900 in accordance with an embodiment of the present invention.

As shown in FIG. 17, in step 941, generating an error signal based on one of the N control signals (SW1, SW2, . . . , $SW_N$) and the corresponding one of the N clock signals (CLK1, CLK2, . . . , $CLK_N$). For example, the error signal $VCO_N$ is generated based on the control signal $SW_N$ and the clock signal $CLK_N$, and the error signal $VCO_N$ is indicative of a phase shift between the control signal $SW_N$ and the clock signal $CLK_N$. In an embodiment, the control signal $SW_N$ may comprise a high-side control signal $HS_N$ and a low-side control signal $LS_N$, and the error signal $VCO_N$ may be generated based on the high-side control signal $HS_N$ and the clock signal $CLK_N$.

In step 942, generating an off time signal based on the corresponding one of the N voltage feedback signals (VFB1, VFB2, . . . , $VFB_N$) and a corresponding one of the N voltage reference signal. For example, the off time signal $TOFF_N$ is generated by comparing the voltage feedback signal $VFB_N$ with the voltage reference signal $VREF_N$.

In step 943, generating an on time signal based on the input voltage signal VIN, the corresponding one of the N output voltage signals (VOUT1, VOUT2, . . . , $VOUT_N$) and the corresponding error signal. For example, the on time signal $TON_N$ is generated based on the input voltage signal VIN, the output voltage signal $VOUT_N$ and the error signal $VCO_N$.

In step 944, generating the corresponding one of the N control signals by conducting a logic operation to the off time signal and the on time signal. For example, the control signal $SW_N$ by conducting a logic operation to the off time signal $TOFF_N$ and the on time signal $TON_N$.

Obviously many modifications and variations of the present invention are possible in light of the above teachings. It is therefore to be understood that within the scope of the appended claims the invention may be practiced otherwise than as specifically described. It should be understood, of course, the foregoing invention relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

The invention claimed is:

1. A multi-output DC-DC converter with constant on time (COT) control, comprising:
   N switching circuits, coupled to an input terminal of the multi-output DC-DC converter to receive an input voltage signal, wherein each of the N switching circuits is configured to convert the input voltage signal to an output voltage signal at one of N output terminals of the multi-output DC-DC converter, and wherein each of the N switching circuits comprises at least one controllable switch, and wherein N is an integer larger than or equal to 2;
   a clock generator, configured to generate N clock signals having the same frequency and having a predetermined phase shift between every two successive clock signals of the N clock signals; and
   N COT controllers, wherein each of the N COT controller is configured to control a corresponding one of the N switching circuits, and wherein each of the N COT controllers is configured to receive the input voltage signal, the output voltage signal, a voltage feedback signal indicative of the output voltage signal, and a corresponding one of the N clock signals to generate a control signal, and further configured to synchronize the control signal with said corresponding one of the N clock signals when a corresponding one of the N switching circuits is operated in a steady state, wherein the control signal is configured to control the at least one controllable switch of the corresponding one of the N switching circuits; wherein each of the N COT controllers comprises:
   a phase locked loop, configured to receive the control signal, said corresponding one of the N clock signals and an enable signal, wherein the phase locked loop is configured to generate an error signal based on the control signal and said corresponding one of the N clock signals once the enable signal is active, and wherein the error signal is indicative of a phase shift between the control signal and said corresponding one of the N clock signals;
   an OFF time generator, configured to receive a voltage feedback signal indicative of the output voltage signal, and further configured to compare the voltage feedback signal with a voltage reference signal to generate an off time signal;
   an ON time generator, configured to receive the input voltage signal, the output voltage signal and the error signal to generate an on time signal; and
   a logic circuit, configured to receive the off time signal and the on time signal, and further configured to conduct a logic operation to the off time signal and the on time signal to generate the control signal.

2. The multi-output DC-DC converter of claim 1, wherein the at least one controllable switch comprises a high-side switch and a low-side switch, and wherein the control signal comprises a high-side control signal configured to control the high-side switch, and a low-side control signal configured to control the low-side switch, and wherein the phase locked loop comprises:
   a first D flip-flop, having a first terminal configured to receive a supply voltage signal, a second terminal configured to receive said corresponding one of the N clock signals, a third terminal, an enable terminal, and an output terminal;
   a second D flip-flop, having a first terminal configured to receive the supply voltage signal, a second terminal configured to receive the high-side control signal, a third terminal coupled to the third terminal of the first D flip-flop, an enable terminal coupled to the enable terminal of the first D flip-flop to receive the enable signal, and an output terminal;
   an AND gate, having a first input terminal coupled to the output terminal of the first D flip-flop, a second input terminal coupled to the output terminal of the second D flip-flop, an output terminal coupled to the third input terminal of the first D flip-flop and the third input terminal of the second D flip-flop;
   a first switch, having a first terminal, a second terminal connected to a first current source, a control terminal coupled to the output terminal of the first D flip-flop;
   a second switch, having a first terminal coupled to the first terminal of the first switch and operated as an output terminal of the phase locked loop to provide the error signal, a second terminal connected to a logic ground through a second current source, a control terminal coupled to the output terminal of the second D flip-flop; and
   a capacitor, connected between the logic ground and the first terminal of the first switch and the first terminal of the second switch.

3. The multi-output DC-DC converter of claim 1, wherein the ON time generator comprises:
   a push-pull circuit, configured to receive the error signal to generate a compensation current signal;
   a controlled current source, coupled between a supply voltage and an output terminal of the push-pull circuit to provide a charging current signal;
   a capacitor, connected between the output terminal of the push-pull circuit and a logic ground;
   a reset switch, having a first terminal coupled to the output terminal of the push-pull circuit, a second terminal connected to the logic ground, and a control terminal;
   a controlled voltage signal generator, configured to generate a controlled voltage signal; and
   a charge comparator, having a first input terminal configured to receive the controlled voltage signal, a second input terminal coupled to the output terminal of the push-pull circuit, and an output terminal, wherein the charge comparator is configured to compare the controlled voltage signal and the voltage across the capacitor to generate the on time signal.

4. The multi-output DC-DC converter of claim 3, wherein when the switching circuit has a BUCK topology, the charging current signal is proportional to the input voltage signal, and the controlled voltage signal is proportional to the output voltage signal.

5. The multi-output DC-DC converter of claim 3, wherein when the switching circuit has a BOOST topology, the charging current signal is proportional to the output voltage signal, and the controlled voltage signal is proportional to the difference of the output voltage signal and the input voltage signal.

6. The multi-output DC-DC converter of claim 3, wherein each of the N COT controllers further comprises an enable signal generator configured to generate the enable signal.

7. The multi-output DC-DC converter of claim 6, wherein the enable signal generator comprises a clamping circuit configured to compare a phase of the control signal to a phase of said corresponding one of the N clock signals to generate a first clamping signal, and wherein when a phase shift between the phase of the high-side control signal and the phase of said corresponding one of the N clock signals is larger than a reference phase shift, the first clamping signal is used as the enable signal to disable the phase locked loop.

8. The multi-output DC-DC converter of claim 7, the clamping circuit comprises a hysteresis comparator configured to receive a current reference signal and the compensation current signal, and further configured to compare the current reference signal to the compensation current signal to generate the first clamping signal, wherein the current reference signal is proportional to the charging current signal.

9. The multi-output DC-DC converter of claim 6, wherein the enable signal generator comprises a light-load determining circuit configured to determine whether the corresponding switching circuit among the N switching circuits is operated in a light-load condition, and further configured to provide a second clamping signal, and wherein when the corresponding switching circuit among the N switching circuits is operated in the light-load condition, the second clamping signal is used as the enable signal to disable the phase locked loop.

10. The multi-output DC-DC converter of claim 1, wherein each of the N switching circuits comprises the same topology.

11. The multi-output DC-DC converter of claim 1, wherein the N switching circuits comprise at least two different topologies.

* * * * *